(12) United States Patent
Jordan et al.

(10) Patent No.: US 10,509,054 B2
(45) Date of Patent: Dec. 17, 2019

(54) HIGH/LOW TEMPERATURE CONTACTLESS RADIO FREQUENCY PROBES

(71) Applicant: United States of America, as represented by the Administrator of NASA, Washington, DC (US)

(72) Inventors: Jennifer L. Jordan, Cleveland, OH (US); Rainee N. Simons, Cleveland, OH (US)

(73) Assignee: United States of America as Represented by the Administrator of National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 16/002,442

(22) Filed: Jun. 7, 2018

(65) Prior Publication Data
US 2018/0299488 A1    Oct. 18, 2018

Related U.S. Application Data

(62) Division of application No. 14/573,216, filed on Dec. 17, 2014, now Pat. No. 10,114,040.
(Continued)

(51) Int. Cl.
| | |
|---|---|
| *H01P 3/08* | (2006.01) |
| *H01P 5/00* | (2006.01) |
| *H01P 5/08* | (2006.01) |
| *H01P 5/18* | (2006.01) |
| *G01R 1/067* | (2006.01) |
| *G01R 1/07* | (2006.01) |
| *G01R 31/00* | (2006.01) |

(Continued)

(52) U.S. Cl.
CPC ........... *G01R 1/07* (2013.01); *G01R 1/06772* (2013.01); *G01R 31/00* (2013.01); *H01Q 1/38* (2013.01); *H01Q 9/045* (2013.01); *H01Q 9/0407* (2013.01); *H01Q 13/106* (2013.01)

(58) Field of Classification Search
CPC .... H01P 3/08; H01P 5/00; H01P 5/028; H01P 5/08; H01P 5/107; H01P 5/18; G01R 1/06772

See application file for complete search history.

(56) References Cited

U.S. PATENT DOCUMENTS

| | | |
|---|---|---|
| 5,041,782 A | 8/1991 | Marzan |
| 5,457,399 A | 10/1995 | Krumm |

(Continued)

OTHER PUBLICATIONS

Jordan, J.L., Simons, R.N., Zorman, C.A.; title "Contactless Radio Frequency Probes for High-Temperature Characterisation of Microwave Integrated Circuits"; Electronics Letters; May 22, 2014; pp. 817-819; vol. 50 No. 11.

(Continued)

*Primary Examiner* — Neel D Shah
(74) *Attorney, Agent, or Firm* — Robert H. Earp, III; William M. Johnson

(57) ABSTRACT

A contactless radio frequency (RF) probe. The RF probe includes a dielectric substrate, at least one waveguide comprising an electric field configured to increase the coupling between the dielectric substrate and the at least one waveguide, and an air gap separating the dielectric substrate and the at least one waveguide to prevent thermal loading, thermal expansion, and material deformity.

18 Claims, 17 Drawing Sheets

Related U.S. Application Data

(60) Provisional application No. 61/919,092, filed on Dec. 20, 2013.

(51) Int. Cl.
*H01Q 13/10* (2006.01)
*H01Q 9/04* (2006.01)
*H01Q 1/38* (2006.01)

(56) References Cited

U.S. PATENT DOCUMENTS

| | | | |
|---|---|---|---|
| 6,058,497 | A | 5/2000 | Tuttle |
| 6,484,279 | B2 | 11/2002 | Akram |
| 6,640,323 | B2 | 10/2003 | Akram |
| 7,928,750 | B2 | 4/2011 | Miller |
| 8,253,428 | B2 | 8/2012 | Komoto |
| 2004/0113239 | A1* | 6/2004 | Prokofiev ............... H01L 23/48 257/662 |
| 2007/0236232 | A1 | 10/2007 | Aghababazadeh et al. |
| 2009/0085589 | A1 | 4/2009 | Hsieh et al. |
| 2010/0164519 | A1 | 7/2010 | Sellathamby et al. |
| 2010/0231332 | A1* | 9/2010 | Sugimoto ............... H01P 5/107 333/254 |
| 2010/0321054 | A1 | 12/2010 | Kameda et al. |
| 2012/0196390 | A1 | 8/2012 | Or-Bach et al. |
| 2013/0106456 | A1* | 5/2013 | Weikle, II et al. ...... G01R 1/04 324/754.06 |

OTHER PUBLICATIONS

Simons, Rainee N.; title "Novel On-Wager Radiation Pattern Measurement Technique for MEMS Actuator Based Reconfigurable Patch Antennas"; NASA/TM-2002-211816; Oct. 2002; 24th Annual Anntenna Measurement Techniques Association Meeting and Symposium cosponsored by the Aeroflex Lintek Corporation and Mission research Corporation; Cleveland, Ohio; Nov. 3-8, 2002.

\* cited by examiner

HIGH/LOW TEMPERATURE CONTACTLESS RADIO FREQUENCY PROBES

CROSS REFERENCE TO RELATED APPLICATION

This application is a divisional patent application, and claims priority to, U.S. patent application Ser. No. 14/573,216, filed Dec. 17, 2014, which is a non-provisional of, and claims priority to, U.S. Provisional Patent Application Ser. No. 61/919,092, filed Dec. 20, 2013. The subject matter of these earlier-filed applications are hereby incorporated by reference in their entirety.

ORIGIN OF THE INVENTION

The invention described herein was made by employees of the United States Government and may be manufactured and used by or for the Government for Government purposes without the payment of any royalties thereon or therefore.

FIELD

The present invention generally pertains to contactless radio frequency (RF) probes, and more particularly, to high temperature and low temperature contactless RF probes for characterizing microwave integrated circuits (MICs), monolithic microwave integrated circuits (MMICs) on semiconductor wafers, and devices.

BACKGROUND

Generally, on-wafer probing techniques are used to characterize MICs and devices. This requires the use of ground-signal-ground (G-S-G) probes based on a coplanar waveguide (CPW), as shown in FIG. 1, and a microwave precision network analyzer (PNA). For example, CPW 100 includes a strip conductor 105 with a ground plane 110 on each side of strip conductor 105. The CPW G-S-G probes are designed with a coaxial connector or a coax-to-waveguide transition at the input. A variant of this probe is also available as a signal-ground (S-G) or ground-signal (G-S) probe.

These probes, when connected via coaxial cables or waveguides to a PNA for RF measurements, allow a set-up to be calibrated using an impedance standard substrate (ISS). See, for example, FIG. 2, which shows a microstrip 200 with a strip conductor 205 on the top of microstrip 200 and a ground plane 210 beneath microstrip 200. FIG. 3 shows a slot line 300 having a signal coupled within a slot created by ground planes 305.

During the calibration process, software residing on the PNA analytically subtracts the losses associated with the probes and the cables/waveguides, and establishes a reference plane or calibration plane at probe tips. When physical contact is established between the calibrated probes and the device or circuit under test (DUT), the PNA measures and displays the intrinsic device or circuit scattering parameters (S-parameters) or characteristics.

At ambient temperatures, the above-mentioned procedure, which relies on good physical contact between the CPW G-S-G probes and the device or circuit pads, provides excellent results. However, in elevated temperature environments, such as in aircraft engine sensor development, the characteristics of the probe pads degrades and the physical contact with the probe becomes less reliable. In addition, the heat at elevated temperatures destroys the probe tips, which were designed to operate at room temperature. Replacing these probes would be expensive and procurement is time consuming.

Furthermore, in low temperature environments, such as in superconducting device development, the probes and the cables conduct the ambient heat to the cryogenically cooled device or circuit load placed inside a vacuum chamber. The excess heat manifests as an additional thermal load on the cryo-cooler, and thus, limits the lowest attainable temperature. Also, when the physical temperature of the device or circuit is lower, the associated noise figure is lower. When the noise figure is low, the sensitivity of the communications receiver is also higher. Moreover, CPW G-S-G probes tips are co-linear, and therefore, limited to device and circuit characterization on planar surfaces.

Thus, an alternative probe may be beneficial.

SUMMARY

Certain embodiments of the present invention may be implemented and provide solutions to the problems and needs in the art that have not yet been fully solved by conventional probes. For example, some embodiments pertain a contactless RF probe configured to acquire the S-parameter of miniature MICs, MMICs, devices, and printed antennas at elevated and/or cryogenic temperatures.

In one embodiment, an apparatus includes a microstrip associated with a DUT. The apparatus also includes a broadside coupled inverted microstrip configured to exchange RF signals within the apparatus.

In another embodiment, an apparatus (e.g., a contactless RF probe) includes a dielectric substrate with an inverted microstrip line. The inverted microstrip line is broadside coupled with a microstrip line or a slot line of another dielectric substrate of a device under test.

In yet another embodiment, an apparatus includes a dielectric substrate and at least one waveguide. The dielectric substrate includes a DUT, and the at least one waveguide includes an electric field configured to increase the coupling between the dielectric substrate and the at least one waveguide. The dielectric substrate and the waveguide are separated by an air gap to prevent preventing thermal loading, thermal expansion, and material deformity.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Embodiments of the present invention pertain to a high and low temperature contactless RF probe with a broadside coupled inverted microstrip line. In one embodiment, a second microstrip line is inverted and broadside coupled to a first microstrip line having a DUT. An air gap between the first microstrip line and the second microstrip line allows a high and low temperature contactless RF probe to be produced. Depending on the height of the gap and length of the overlap, coupling of the microstrip line and the inverted microstrip line is enhanced or decreased.

Figure 1:
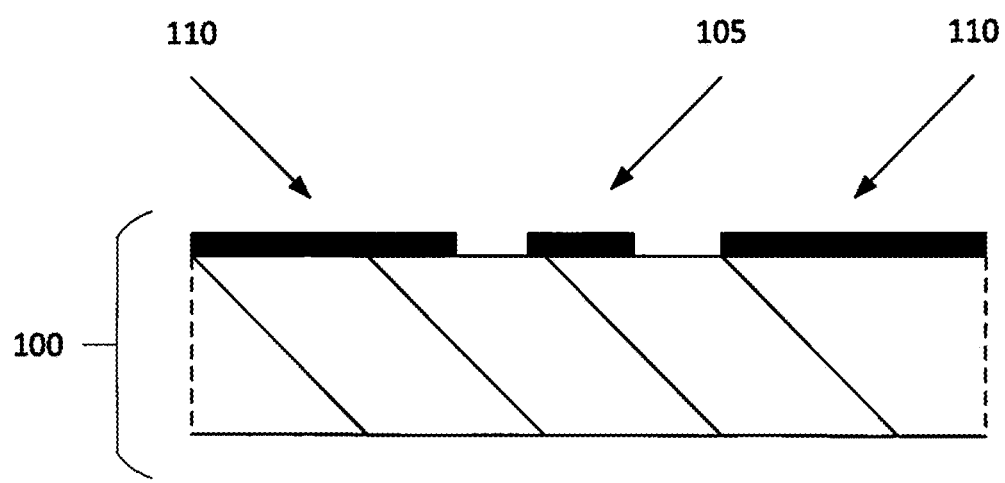
FIG. 1 is related art illustrating a coplanar waveguide.
Figure 2:
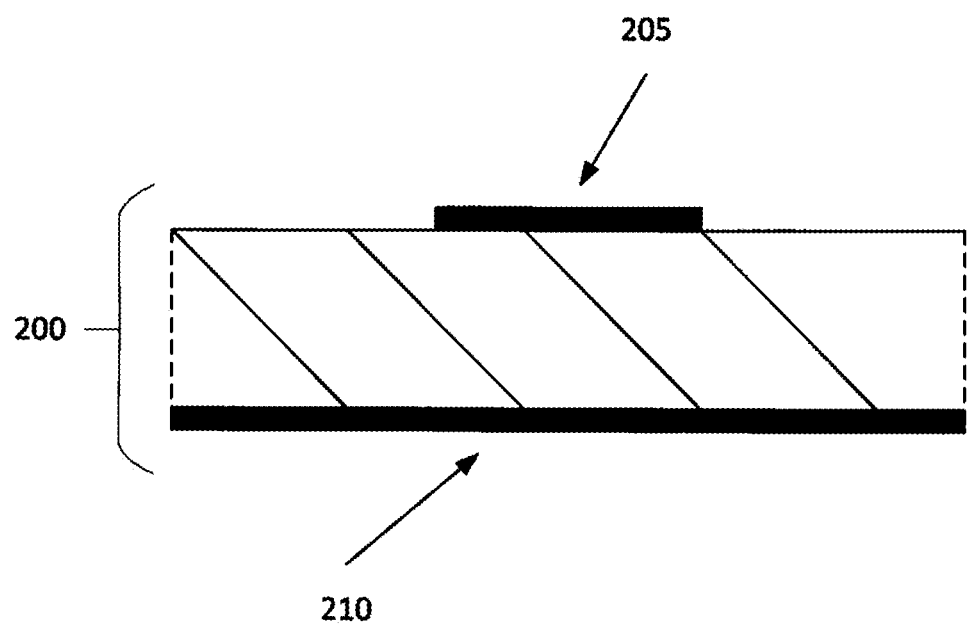
FIG. 2 is related art illustrating a microstrip.
Figure 3:
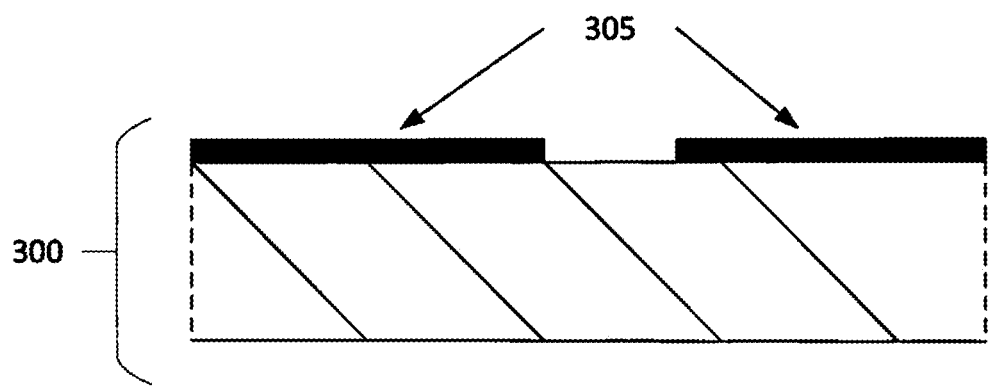
FIG. 3 is related art illustrating a slot line.
Figure 4A:
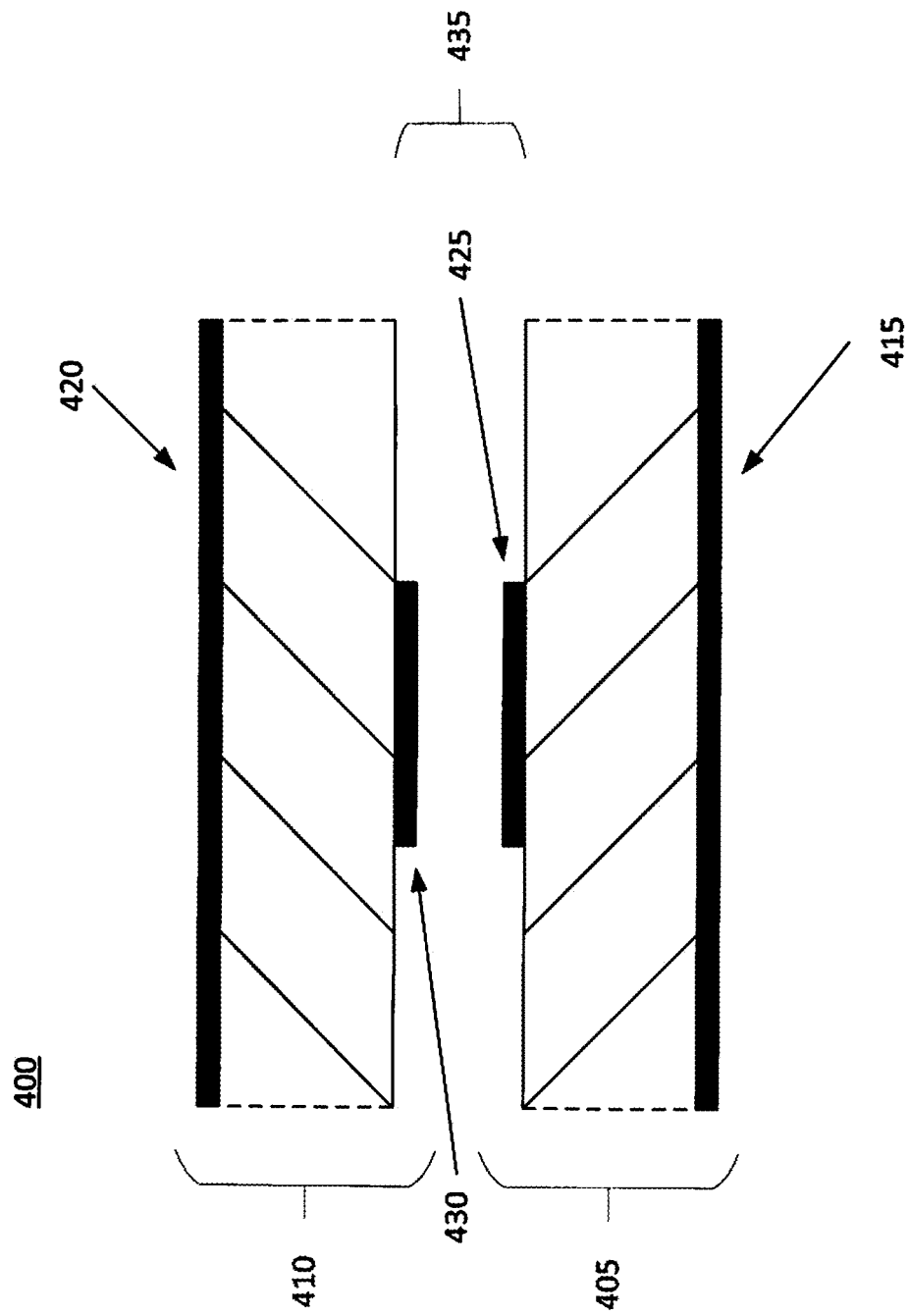
FIG. 4A-4C illustrate a broadside coupled inverted microstrip lines, according to an embodiment of the present invention.
Figure 4B:
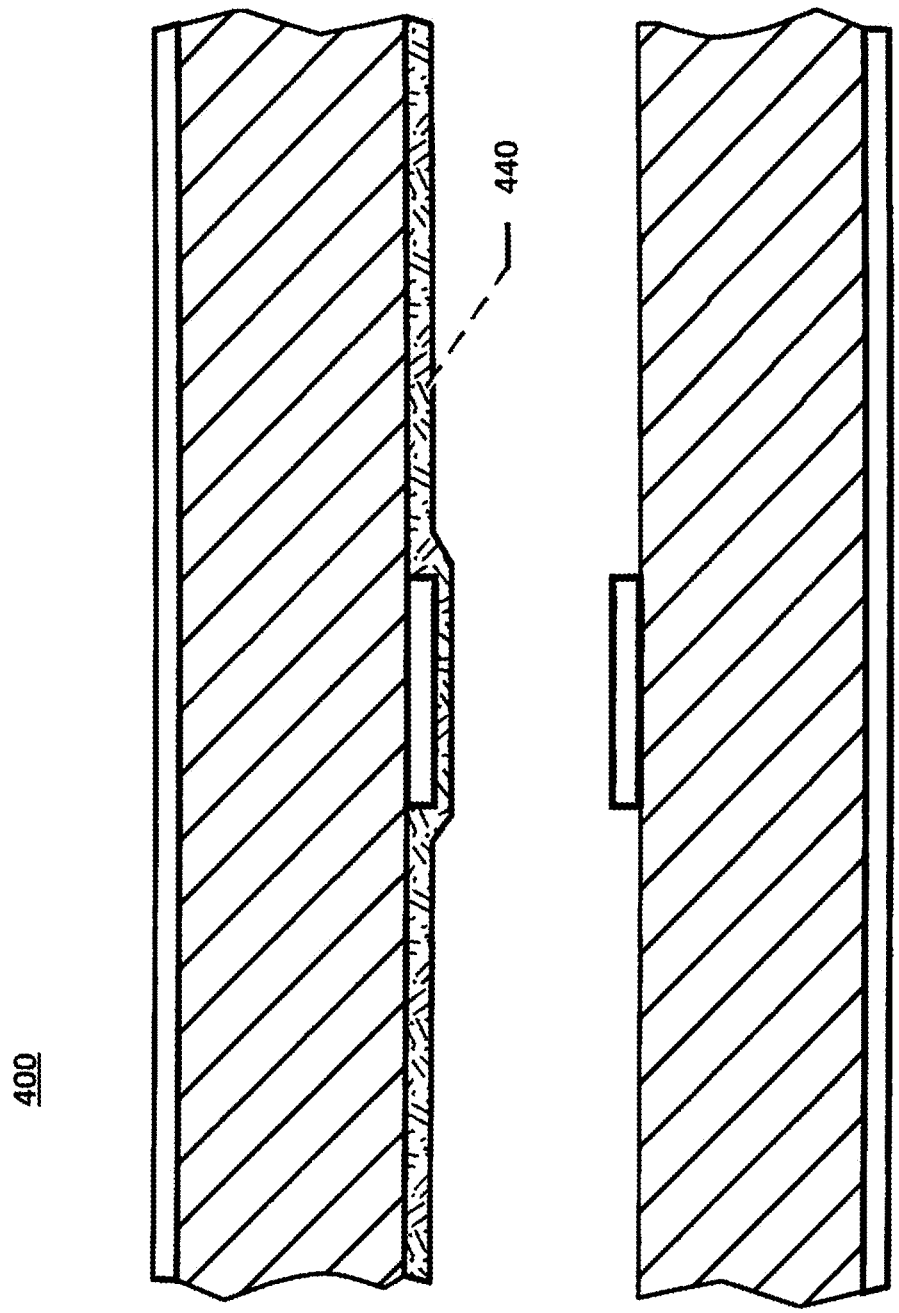
Figure 4C:
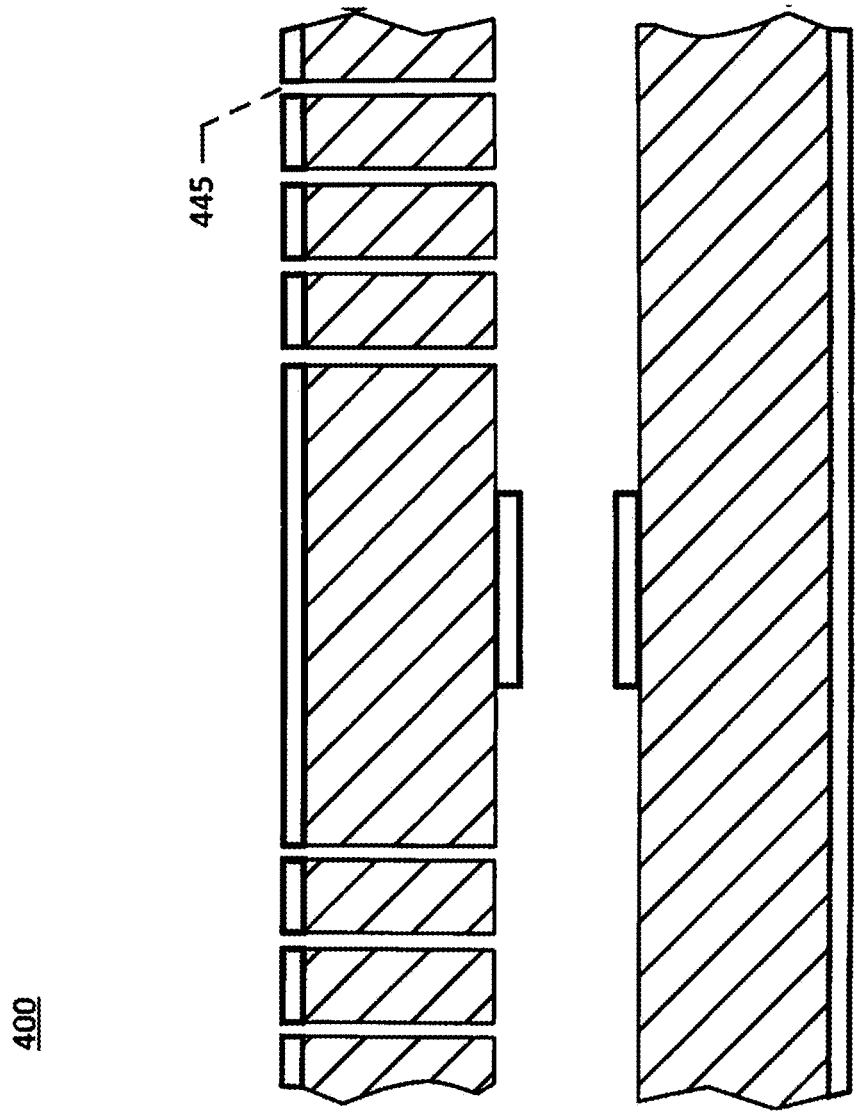

FIGS. 4A-4C illustrates broadside coupled inverted microstrip lines 400, according to an embodiment of the present invention. In this embodiment, a microstrip line 410 is inverted and broadside coupled with microstrip line 405 to perform measurements in a noncontact method. Each microstrip line 405, 410 includes a ground plane 415, 420, and a conductor 425, 430. While this embodiment shows that the width and height of microstrip line 405, 410, ground plane 415, 420, and conductor 425, 430 are uniform, in other embodiment the height and width may be non-uniform and non-homogenous. In certain embodiments, the width and height of microstrip line 405, 410, including dielectric substrates, may be uniform, non-uniform, homogeneous, non-homogeneous, or any combination thereof. Also, in a further embodiment, the dielectric substrates, and possibly microstrip line 405, 410, may be composed of the same or different material.

Microstrip line 405 may be part of, or associated with, the DUT, and may operate at high temperatures. Microstrip line 410 may be a transmission line and part of the probe. Microstrip lines 405, 410 are separated by an air gap 435 configured to electromagnetically couple the signal without destroying the contactless RF probe. Air gap 435 allows microstrip line 410 to operate at a lower temperature than microstrip line 405 with the DUT, which operates at a higher temperature. Air gap 435 may be less than or equal to 1.0 millimeter in some embodiments.

To further ensure that microstrip lines 405, 410 operate at their respective temperatures, microstrip line 410 may include a protective coating 440 in some embodiments. Protective coating 440 may reflect the heat from microstrip line 405. In other embodiments, microstrip line 410 may include ventilation holes 445. Ventilation holes 445 allows any heat trapped within air gap 435 to escape. These ventilation holes 445 may prevent microstrip line 410 from overheating. In a further embodiment, microstrip line 410 may include a protective coating 440 and ventilation holes 445 to increase rejection of heat or ventilation effectiveness.

Figure 5:
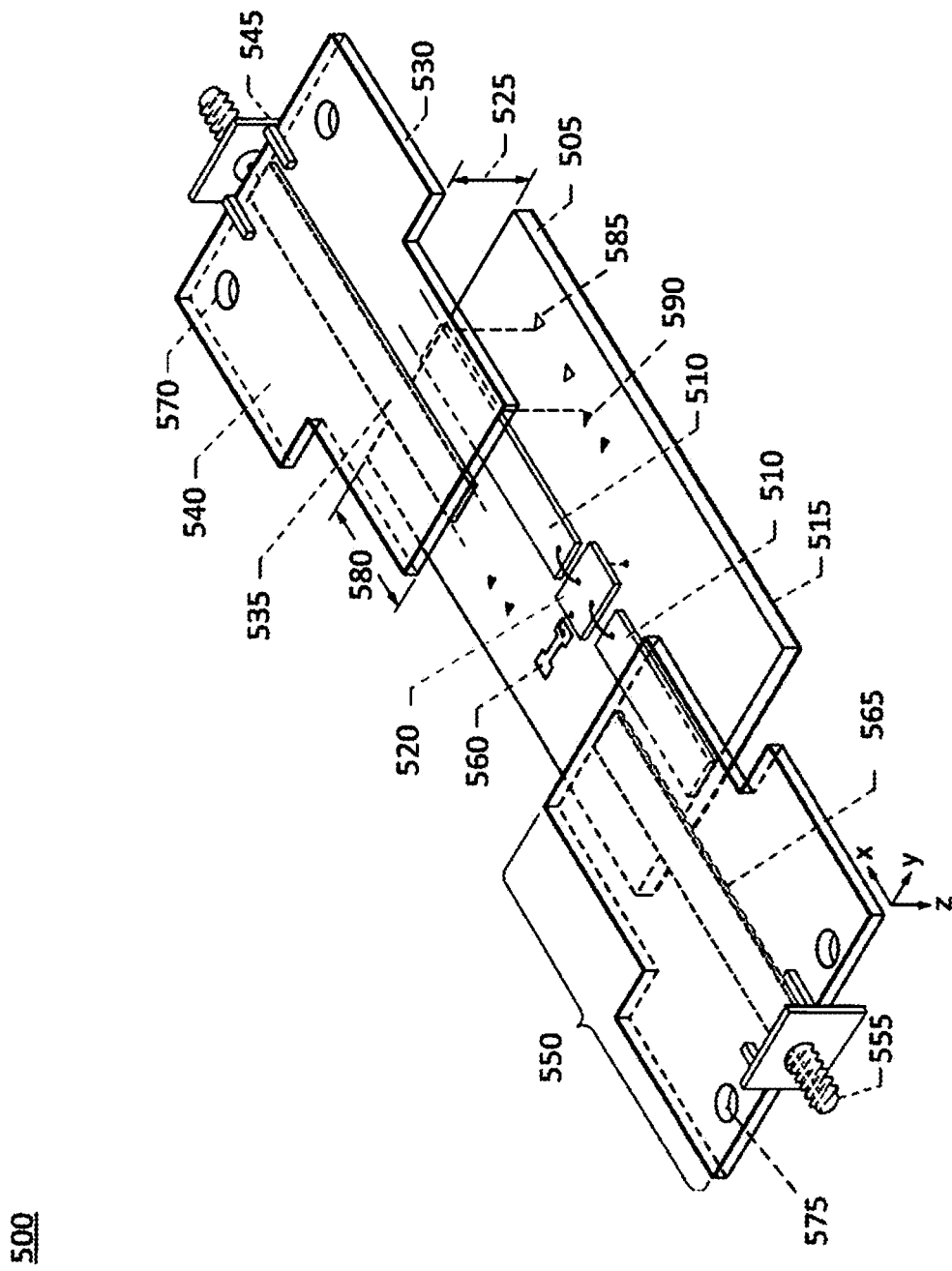
FIG. 5 is a circuit diagram illustrating a contactless RF probe with an inverted microstrip line, according to an embodiment of the present invention.

FIG. 5 is a circuit diagram illustrating a contactless RF probe 530 with a broad side coupled inverted microstrip line 535, according to an embodiment of the present invention. In this embodiment, a dielectric substrate 505 includes microstrip lines 510 and a DUT 520 in the center. At the opposite ends, microstrip lines 510 are terminated in an open circuit. In another embodiment, microstrip line 510 may be terminated in a match load or chip antenna. Dielectric substrate 505 in this embodiment may also include a direct current (DC) bias pad 560. DC bias pad 560 may apply a bias voltage to the active DUT. A ground plane 515 is located beneath dielectric substrate 505 in this embodiment.

An air gap 525 separates dielectric substrate 505 and contactless RF probe (synonymous with dielectric substrate) 530. Beneath dielectric substrate 530 is an inverted microstrip line 535 that may be open circuit in one embodiment. In another embodiment, inverted microstrip line 535 may be short circuited or match terminated (e.g., match load or chip antenna). Inverted microstrip line 535, in this embodiment, faces, or is directly above, microstrip line 510, allowing inverted microstrip line 535 to be broadside coupled with microstrip line 510. In this embodiment, the width of microstrip line 535 is uniform. However, in other embodiments, the width of microstrip line 535 may be stepped, tapered, or non-uniform. For example, a portion of microstrip line 535 may have a certain width, while another portion of microstrip line 535 has another width. This may be done to improve impedance matching bandwidth, which enhances coupling and increases bandwidth.

Similar to dielectric substrate 505, dielectric substrate 530 also includes a ground plane 540. Dielectric substrate 530 further includes a connector 545 configured to connect with a network analyzer. In certain embodiments, connector 545 may be a coaxial connector. While this embodiment shows a two-port DUT circuit, i.e., dielectric substrate 505, other embodiments may include a one-port DUT circuit or a N-port DUT circuit.

A separate probe 550 may also include an inverted microstrip line 565 and a connector 555 configured to connect with the DUT. In certain embodiment, connector 555 may be a coaxial connector. The DUT may include a one-port circuit, such as a printed antenna. Additionally, the DUT may include two-port circuits to N-port circuits. Examples of two-port circuits include filters, switches, frequency doublers, and amplifiers. Examples of N-port circuits include directional couplers, power dividers/combiners, and mixers. These may be either passive, active, or combination of passive and active devices or circuits. Mounting holes 570 are configured to mount substrate 530 to a probe station. In certain embodiments, micro-positioners (not shown) allow air gap 525 to be increased or decreased. In particular, micro-positioners allow for movement in x-, y-, and z-directions. For example, micro-positioners enable the RF probes to be aligned (x, y), increase or decrease overlap of inverted microstrip 535 and microstrip 510 (x, y), and increase or decrease the air gap (z). Mounting holes 575 are similarly configured to mount probe 550 to probe station. Substrate 505 is configured to conformal mount to a surface, such as a sensor or tube or any ambient, hot or cold surface.

Proximity coupled microstrip section 580 may be uniform, non-uniform, stepped, or tapered. Proximity coupled microstrip section 580 allows signals to be exchanged with DUT 520. Bias 560 is used in some embodiments for active circuit. Side-to-side (y-axis) alignment marks 585 and front-to-back (x-axis) alignment marks 590 ensure that microstrip lines 510 and 535 overlap one another.

Figure 6:
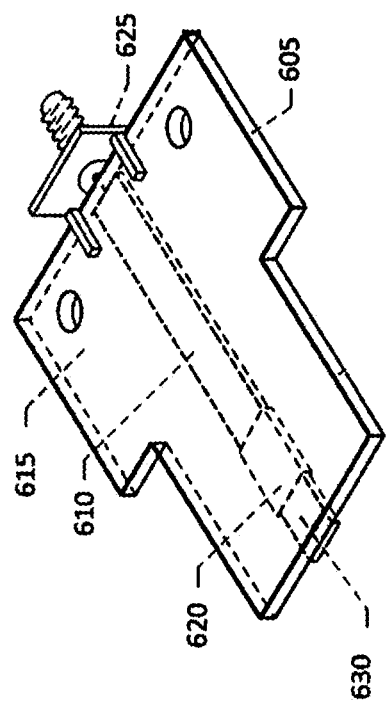
FIG. 6 is a circuit diagram illustrating a contactless RF probe with a terminated inverted microstrip line, according to an embodiment of the present invention.

FIG. 6 is a circuit diagram illustrating a contactless RF probe 600 with an inverted microstrip line 610, according to an embodiment of the present invention. In some embodiments, contactless RF probe 600 may be curved, i.e., may be concave or convex, along x-, y-, or z-axis, or any combination thereof. In this embodiment, contactless RF probe includes a dielectric substrate 605. Above dielectric substrate 605 is a ground plane 615, and beneath dielectric substrate 605 is an inverted microstrip line 610. Inverted microstrip line 610 is terminated in a match load 620, with the opposite end of match load (or a chip antenna) 620 terminated in a short circuit or ground 630. Match load 620 in this embodiment improves the impedance match to coaxial connector 625 for connection to a PNA. In other words, inverted microstrip 610 is terminated either in a known impedance, such as a chip antenna for near-field coupling, or a matched load. At the other end of microstrip line 610 is a connector 625.

Figure 7:
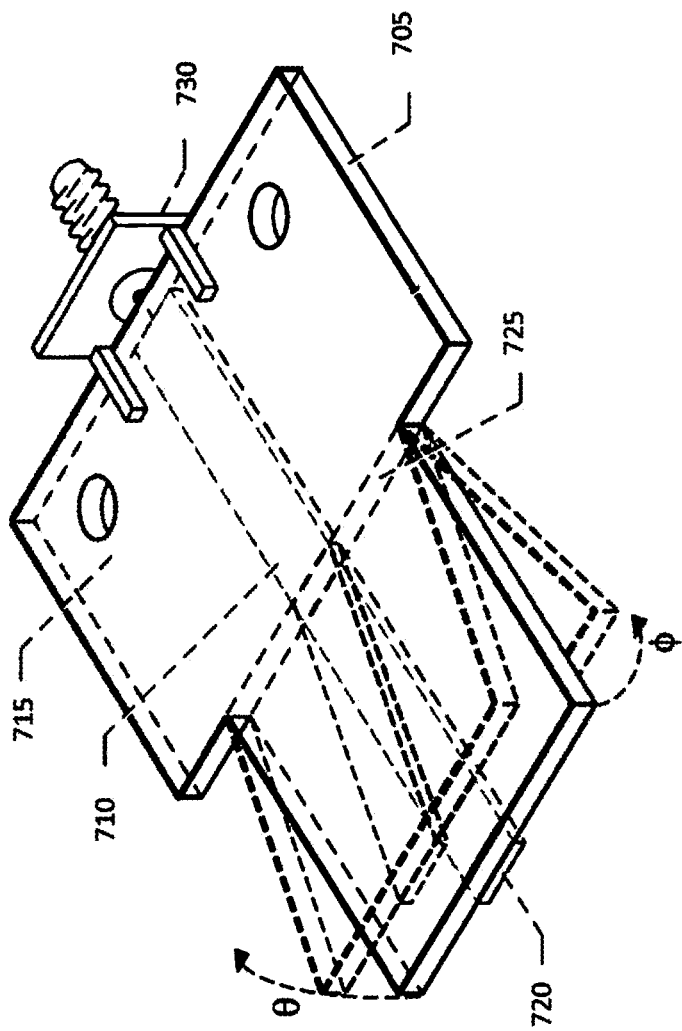
FIG. 7 is a circuit diagram illustrating a contactless RF probe with a variable gap between inverted microstrip lines, according to an embodiment of the present invention.

FIG. 7 is a circuit diagram illustrating a contactless RF probe 700 with a variable gap between the broadside coupled inverted microstrip lines, according to an embodiment of the present invention. Similar to FIG. 6, contactless RF probe 700 includes dielectric substrate 705, which may be curved. Dielectric substrate 705 includes an inverted microstrip line 710 and a ground plane 715. However, in this embodiment, dielectric substrate 705 is flexible. In particular, dielectric substrate 705 includes hinges 725, allowing contactless RF probe 700 to have an additional degree of flexibility. This causes the air gap below strip 720, which is part of inverted microstrip line 710, to remain uniform or flare. However, in other embodiments, the width of strip 720 may be stepped, tapered, flared, or non-uniform. Furthermore, the hinges 725 increase or decrease the air gap between contactless RF probe 700 and the substrate with the DUT.

Figure 8:
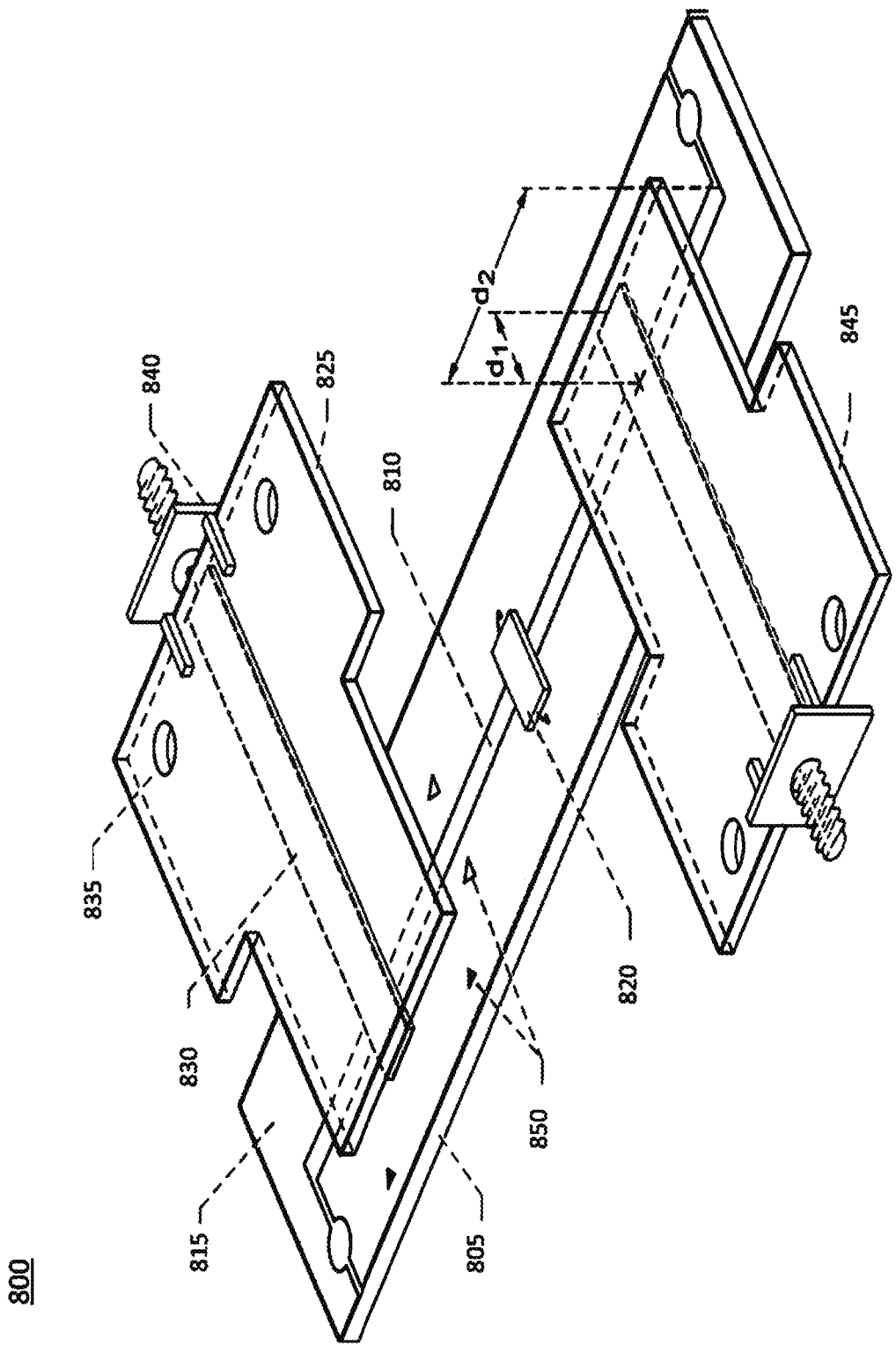
FIG. 8 is a circuit diagram illustrating a contactless RF probe coupled to a slot line substrate, according to an embodiment of the present invention.

FIG. 8 is a circuit diagram 800 illustrating a contactless RF probe 825 coupled to a slot line substrate 805, according to an embodiment of the present invention. In this embodiment, slot line substrate (synonymous with dielectric substrate in some embodiments) 805 is in a slot line configuration, and includes a slot line 810, a ground plane 815, and a DUT 820. Contactless RF probe (synonymous with dielectric substrate in some embodiments) 825 includes an inverted microstrip line 830, a ground plane 835, and a connector 840. In this embodiment, contactless RF probe 825 and probe 845 would be perpendicular to, and situated above, dielectric substrate 805. Alignment marks 850 ensure that a portion of contactless RF probe 825, including inverted microstrip line 830, are placed above slot line 810.

This embodiment allows testing of DUT 820 with slot line 810. Slot line 810 allows shunt mounting of components. Additionally, the width of a slot line may be increased resulting in higher impedance. The increase of the width may easily be fabricated compared to narrowing of the strip of a microstrip. Moreover, the thickness of substrate 805 is not critical because the fields are tightly bound to a slot region of slot line 810. Inverted microstrip line 830 and slot line 810 are complementary transmission lines.

It should be appreciated that in certain embodiments contactless RF probe 825 and probe 845 may be linear with dielectric substrate 805. For those embodiments, the transmission line on contactless RF probe 825 and probe 845 would be similar to slot line transmission line, i.e., slot line 810. In other words, the transmission lines in these embodiments include two broadside coupled slot lines.

It should also be appreciated that in this embodiment distance $d_1$ is equal to a quarter guide wavelength of inverted microstrip line 830 and distance $d_2$ is equal to a quarter slot guide wavelength of slot line 810. This circuit layout provides strong coupling between inverted microstrip line 830 and slot line 810. This embodiment also includes virtual short circuits at the two opposite ends of the slot line for DC biasing of active devices. A virtual short circuit is created when the slot line is terminated in an open circuit at a distance equal to a quarter of slot guide wavelength from the physical end. Such an arrangement allows the DUT to be biased (not shown).

Figure 9:
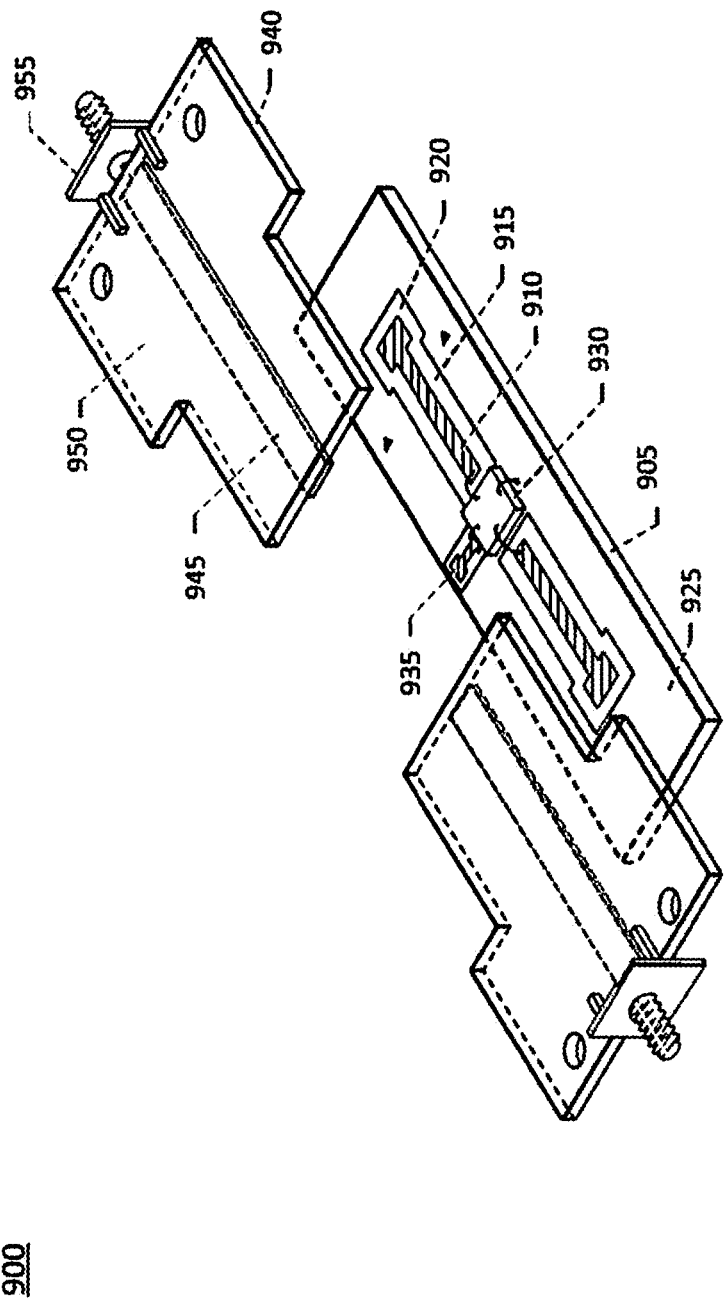
FIG. 9 is a circuit diagram illustrating a contactless RF probe coupled to a CPW substrate, according to an embodiment of the present invention.

FIG. 9 is a circuit diagram 900 illustrating a contactless RF probe 940 coupled to a CPW substrate 905, according to an embodiment of the present invention. In this embodiment, CPW substrate (synonymous with dielectric substrate in some embodiments) 905 includes a strip conductor 910 having an open circuit or a match load 920. CPW 915 includes the strip conductor 910 and ground plane 925. As shown in FIG. 9, ground plane 925 surrounds strip conductor 910. CPW substrate 905 also includes DUT 930 and biasing pads 935.

Separated by an air gap (not explicitly shown), contactless RF probe (synonymous with dielectric substrate in some embodiments) 940 includes an inverted microstrip line 945, a ground plane 950, and a connector 955. Inverted microstrip line 945 is broadside coupled to the strip conductor 910 of CPW 915. It should be appreciated that in certain embodiments a CPW line may be used instead of inverted microstrip line 945. The CPW line in such an embodiment would be linear to strip conductor 910.

It should be appreciated that CPW 915 allows the center conductor strips and ground planes to be on the same side of the substrate, allowing for series and shunt mounting of components. Furthermore, the need for wrap around ground connection or via hole to ground is no longer required. Also, CPW 915 has lower radiation loss, and size reduction of CPW 915 is possible by scaling strip conductor 910 and ground plane 925 dimensions appropriately, i.e., the impedance is related to the ratio of strip conductor 910 width and distance of separation between ground planes 925 on either sides of strip conductor 910.

Figure 10:
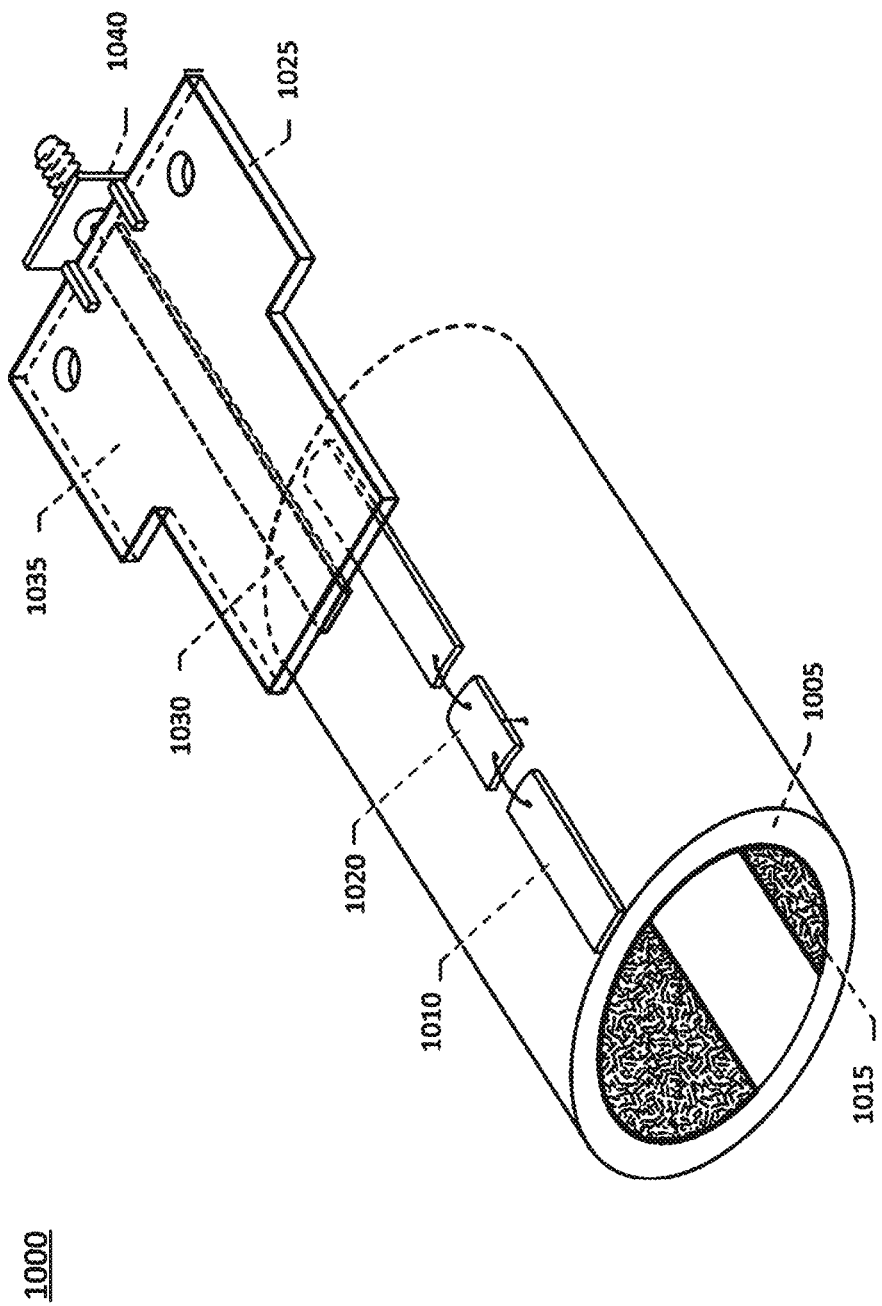
FIG. 10 is a circuit diagram illustrating a contactless RF probe coupled to a non-planar or conformal microstrip line substrate, according to an embodiment of the present invention.

FIG. 10 is a circuit diagram illustrating a contactless RF probe 1025 coupled to a non-planar or conformal microstrip line substrate 1005, according to an embodiment of the present invention. In this embodiment, conformal microstrip line substrate (synonymous with dielectric substrate in some embodiments) 1005 includes a ground plane 1015 and a microstrip line 1010 on each side of DUT 1020. In some embodiments, microstrip line substrate 1005 may be attached to a conformal or non-conformal non-planar surface, e.g., dielectric surface, metal surface, etc. Similarly, microstrip line substrate 1005 and DUT 1020 may be curved along x-, y-, or z-axis, or any combination thereof.

An air gap (not explicitly shown) separates inverted microstrip line 1030 of contactless RF probe (synonymous with dielectric substrate in some embodiments) 1025. Contactless RF probe 1025 also includes a ground plane 1035 and a connector 1040.

It should be appreciated that the circuits may be on a non-planar and/or conformal substrate, such as a conformal or wearable antenna. For example, a circuit may be conformally mounted on an aircraft engine. Likewise, the circuit may be used on oil drilling/exploration platform sensors. Additionally, the circuit may be placed on the surface of a tube, and the tube may be carrying a liquid or a gas that may be heated or cooled. Conventional G-S-G probes are planar, and thus cannot characterize circuits that are mounted on a non-planar probing surface. Similarly, the circuits shown in FIGS. 8 and 9 may include the above non-planar features.

It should also be appreciated that in certain embodiments, the microstrip line substrate 1005 and DUT circuit 1020 may be conformal to a metal tube. In those embodiments, the ground plane is the metal tube, and microstrip line substrate 1005 is conformal to the metal tube. Additionally, it should be appreciated that the contactless RF probe 1025 may be non-planar or conformal as well.

Figure 11:
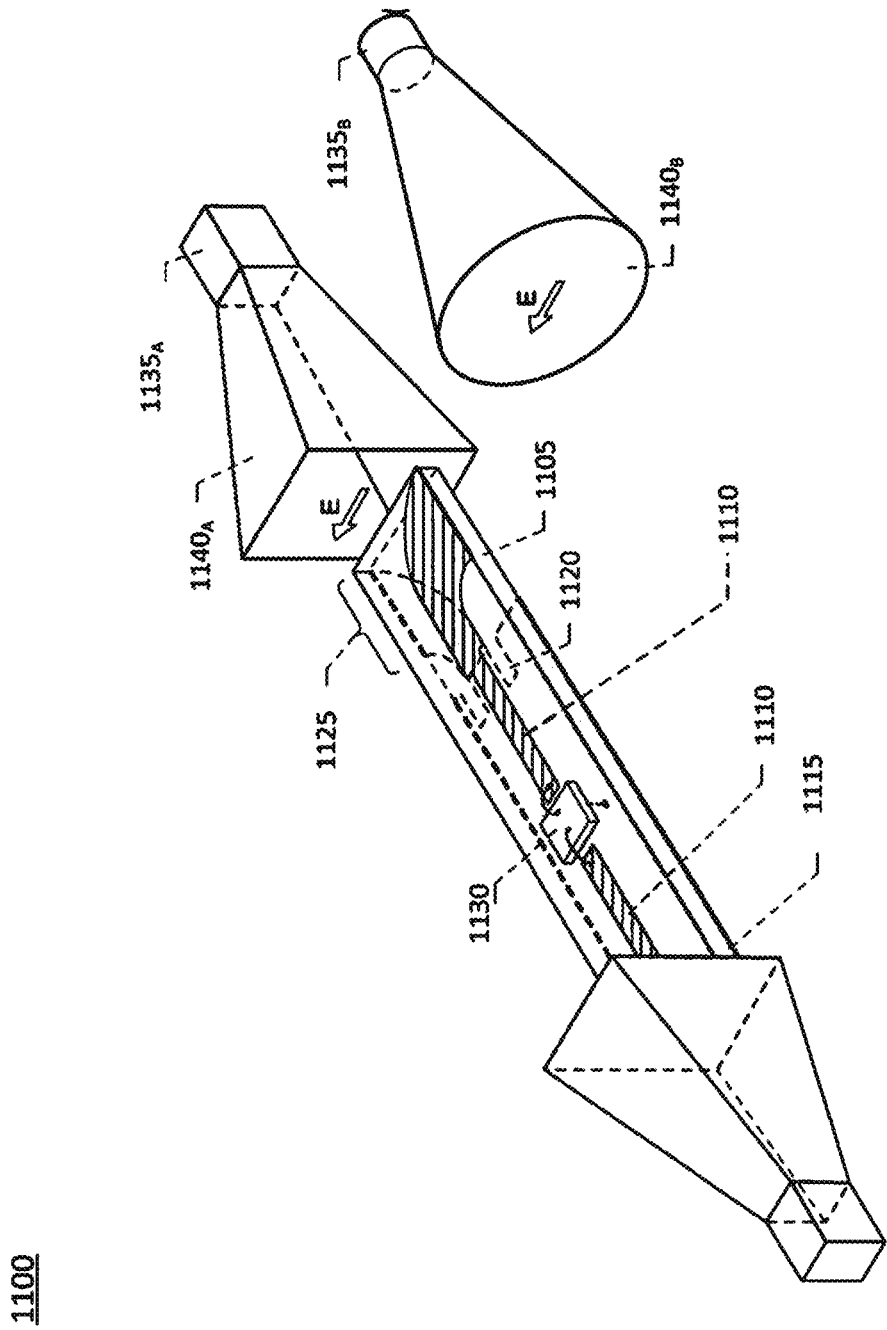
FIG. 11 is a circuit diagram illustrating a contactless RF probe with waveguides, according to an embodiment of the present invention.

FIG. 11 is a diagram 1100 illustrating a contactless RF probe with waveguides 1135$_A$, 1135$_B$, for microstrip applications, according to an embodiment of the present invention. In this embodiments, waveguide may be a metal rectangular waveguide 1135$_A$, a metal circular waveguide 1135$_B$, or any arbitrary shape. Waveguides 1135$_A$ and 1135$_B$, in this embodiment, includes a flared transition region 1140$_A$, 1140$_B$. The flare may be linear, curved or any arbitrary shape. The flare allows the waveguide impedance to be matched with the free space impedance. FIG. 11 also shows the direction for the electric field E. Electric field E in this embodiment is oriented in the direction of the arrow shown in FIG. 11 to increase the strength of the coupling to microstrip transition region 1125 on dielectric substrate 1105. Transition region 1125 in this embodiment includes a curved microstrip line above dielectric substrate 1105 and a strip ground plane below dielectric substrate 1105 curved in the opposite direction. In some embodiments, the curved may be replaced by a series of stepped microstrip line and ground plane in transition region 1125.

This embodiment may operate at millimeter-wave, submillimeter-wave, or terahertz frequencies. Essentially, in this embodiment, the waveguides are noncontact coupled with transition region 1125. Simply put, an air gap separates waveguides 1135$_A$, 1135$_B$ and transition region 1125, and thus dielectric substrate 1105 with DUT 1130, preventing thermal loading, thermal expansion, and material deformity issues.

Also, in this embodiment, dielectric substrate 1105 includes a microstrip line 1110, a microstrip ground plane 1115, a balun 1120, a microstrip transition region 1125, and a DUT 1130. DUT 1130 may be at an ambient temperature or heated or cooled depending on the embodiment. The DUT may be biased as shown in FIG. 5. Also, on the other end of dielectric substrate 1105 is a waveguide similar to waveguide 1135$_A$ or 1135$_B$. This other waveguide may form the second probe for a two-port circuit.

In certain embodiments, the microstrip transition region 1125 behave like a dipole antenna that efficiently couples the electric fields from the output of the waveguide flared transition region 1140$_A$, 1140$_E$ to substrate 1105. In addition, the dipole is a balanced antenna. On the other hand the microstrip line 1110 attached to DUT 1130 is an unbalanced transmission line. Hence, a balance-to-unbalanced transformer or balun is utilized in this embodiment for coupling transition region 1125 to microstrip line 1110 efficiently.

A person of ordinary skill in the art would readily appreciate that waveguide 1135$_A$ and 1135$_B$ support their respective dominant propagating modes. These dominant modes have their electric field E lines oriented or polarized in the direction of the arrows shown in FIG. 11. The indicated orientation enhances the coupling between flared transition region 1140$_A$, 1140$_B$ and microstrip transition region 1125 on dielectric substrate 1105.

Figure 12:
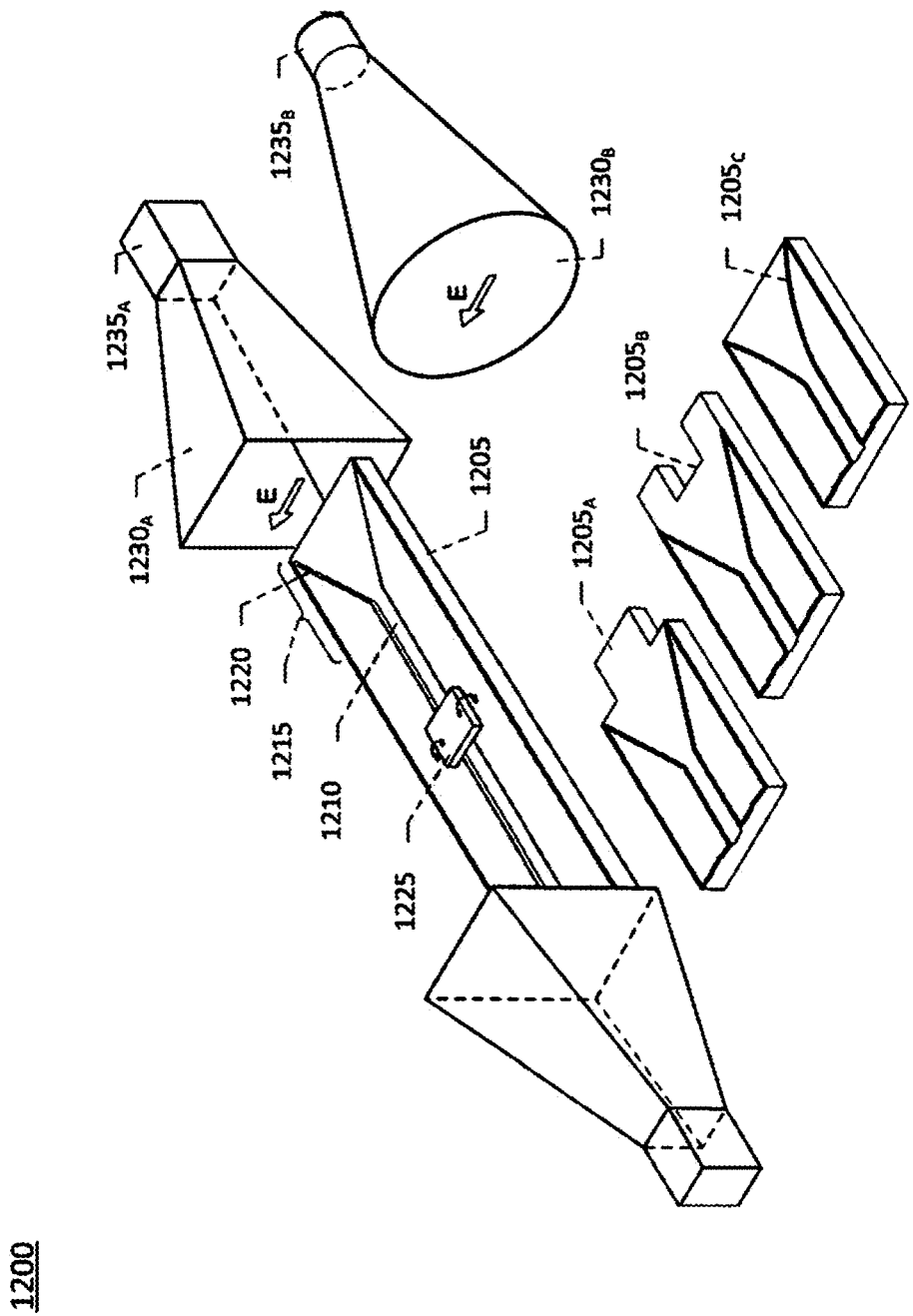
FIG. 12 is a circuit diagram illustrating a contactless RF probe with waveguides for slot line applications, according to an embodiment of the present invention.

FIG. 12 is a diagram 1200 illustrating a contactless RF probe waveguides 1235$_A$, 1235$_B$ for slot line applications, according to an embodiment of the present invention. In this embodiment, the slot line applications may be performed at millimeter-wave or submillimeter-wave or terahertz frequencies. Similar to FIG. 11, waveguide may be rectangular waveguide 1235$_A$, circular waveguide 1235$_B$, or any shape that would be appreciated by a person of ordinary skill in the art. Also similar to FIG. 11, an electric field E is oriented in the direction of the arrow shown in FIG. 12 to increase the strength of the coupling.

The dielectric substrate 1205 includes a slot line 1210 and a DUT 1225. Dielectric substrate 1205 also includes a slot line transition region 1215 with a linear taper 1220. Waveguide 1235$_A$ and 1235$_B$ in this embodiment includes a flared transition region 1230$_A$, 1230$_B$. The slot line transition region 1215, which includes linear taper 1220, and waveguide transition 1230 improves the coupling between slot line 1210 and waveguide 1235$_A$ or 1235$_B$. Similar to FIG. 11, an air gap separates waveguide 1235$_A$, 1235$_B$ and dielectric substrate 1205.

Dielectric substrate 1205 also includes a dielectric step 1205$_A$, dielectric notch 1205$_B$, or a cosine taper 1205$_C$, which may help improve coupling between slot line and waveguide. Also, similar to FIG. 11, DUT 1225 may also be at ambient temperature, heated, or cooled depending on the embodiment. The DUT may be biased as shown in FIG. 8 or FIG. 9.

A person of ordinary skill in the art would readily appreciate that waveguide 1235$_A$ and 1235$_B$ support their respective dominant propagating modes. These dominant modes have their electric field E lines oriented or polarized in the direction of the arrows shown in FIG. 12. The indicated orientation enhances the coupling between the flared transition region 1230$_A$, 1230$_E$ and slot line transition region 1215 on dielectric substrate 1205.

Figure 13:
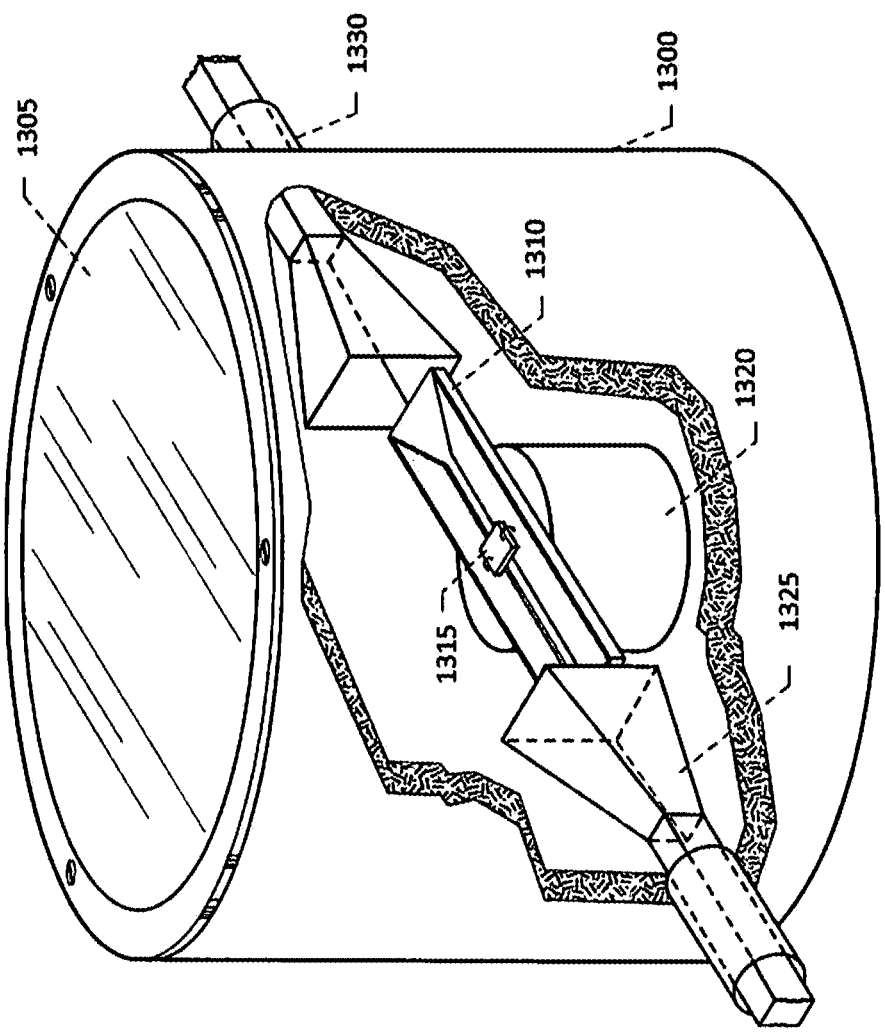
FIG. 13 illustrates a vacuum chamber with contactless RF probes, according to an embodiment of the present invention.

FIG. 13 illustrates a chamber 1300 with a contactless RF probe 1325 for characterization at cryogenic or high temperatures, according to an embodiment of the present invention. Chamber 1300 in this embodiment may be under pressure or vacuum. In this embodiment, contactless RF probe 1325 inserted within chamber 1300 is connected to outside of chamber 1300 by connector 1330. Connector 1330 hermetically seals chamber 1300 to prevent leakage. In some embodiments, contactless RF probes shown in FIGS. 11 and 12 may be inserted within chamber 1300.

A person of ordinary skill in the art would readily appreciate that contactless RF probes 1325 may be inverted microstrip probes, as shown in FIG. 5, or inverted slot line or CPW probes, as described in the other embodiments above, respectively. Likewise, the dielectric substrate with DUT 1315 may use a microstrip, slot line, or CPW transmission lines, and may be conformal. Chamber 1300 may also allow biasing of the DUT as illustrated in FIG. 5 or FIG. 8, or FIG. 9. Located below dielectric substrate 1310 with DUT 1315 is a stage 1320, which may be cooled or heated. The position of stage 1320 may be adjusted via positioners for optimal coupling between dielectric substrate 1310 with DUT 1315 and contactless RF probe 1325. The above arrangement allows contactless RF probing to be performed inside a chamber.

A glass window 1305 is placed on top of chamber 1300. Glass window 1305 allows for visually inspection of the circuit inside chamber 1300, and enables alignment of the probes to the circuit.

Figure 14:
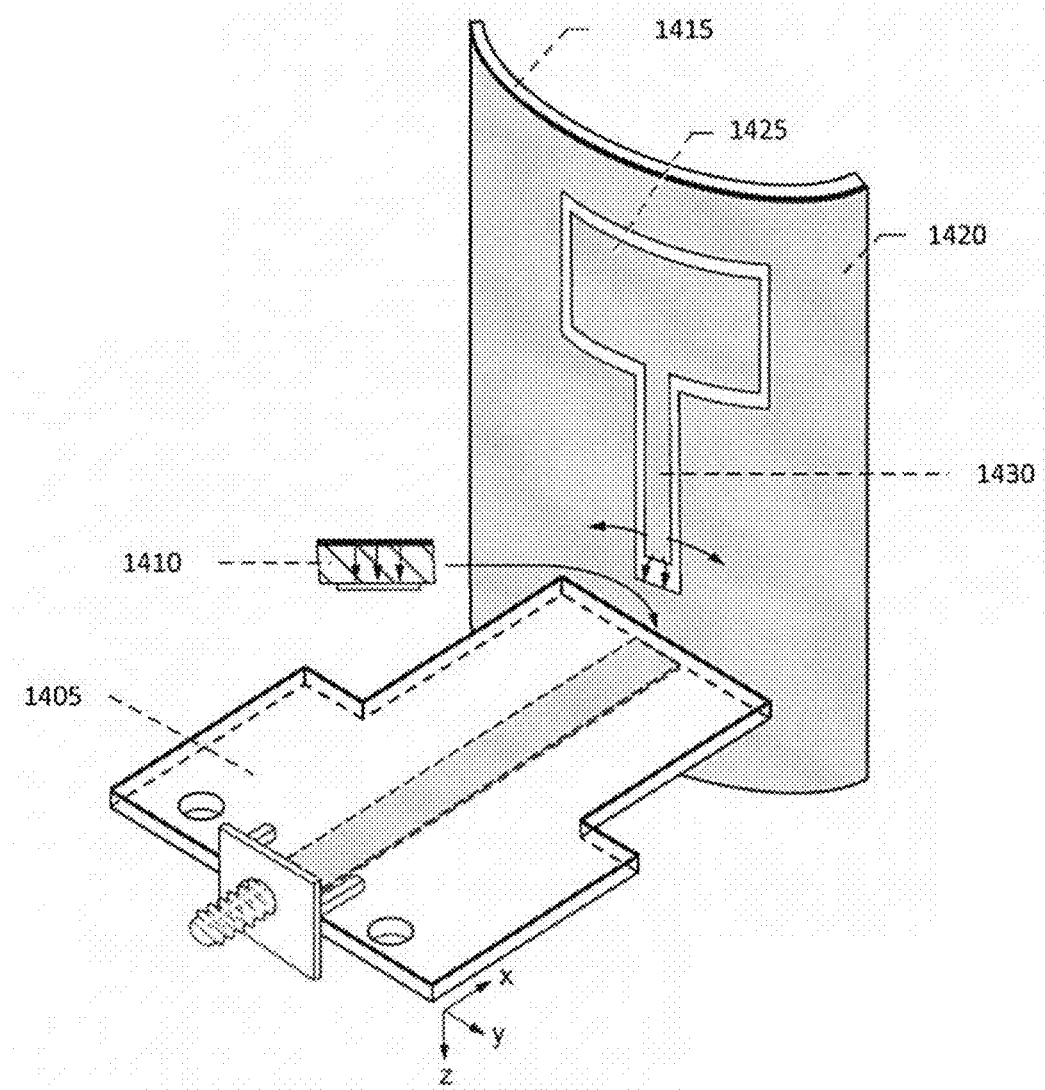
FIG. 14 illustrates a contactless RF probe with a co-planar patch antenna, according to an embodiment of the present invention.

FIG. 14 illustrates a contactless RF probe 1405 coupled to a CPW based patch antenna 1425, according to an embodiment of the present invention. In this embodiment, contactless RF probe 1405 may be similar to the inverted microstrip based contactless probe shown in FIG. 5, and may include electric fields 1410.

A person of ordinary skill in the art would readily appreciate that inverted microstrip transmission line supports a dominant propagating mode with electric field lines 1410 in the cross section oriented as shown in FIG. 14. In addition, a person of ordinary skill in the art would readily appreciate that CPW transmission line also supports a dominant propagating mode with the electric field lines as shown in FIG. 14. Since, electric field lines 1410 in the open end of the inverted microstrip line and in the open end of the coplanar waveguide are oriented in the same direction, a strong coupling takes place between the RF probe 1405 and CPW feed line 1430 when aligned as shown in FIG. 14.

Although not shown, a small air gap separates contactless RF probe 1405 and dielectric substrate 1415 with the DUT. Affixed to dielectric substrate is the DUT, which is a CPW based patch antenna 1425 with CPW feed 1430. Dielectric substrate 1415 may be conformal and may be heated or cooled. Surrounding the CPW based patch antenna 1425 is a ground plane 1420. For example, the patch antenna may be used for transmitting signals from a sensor embedded in an aircraft engine. The patch antenna may also be used for receiving signals. An additional ground plane (not shown) or an air gap with a ground plane (not shown) may be present on the opposite side of the dielectric substrate in another embodiment. In yet another embodiment, CPW feed line 1430 attached to patch antenna 1425 may also include an additional DUT (not shown) such as a MIC transmitter chip, receiver chip, or amplifier chip with appropriate control and biasing circuit as shown in FIG. 9.

Figure 15:
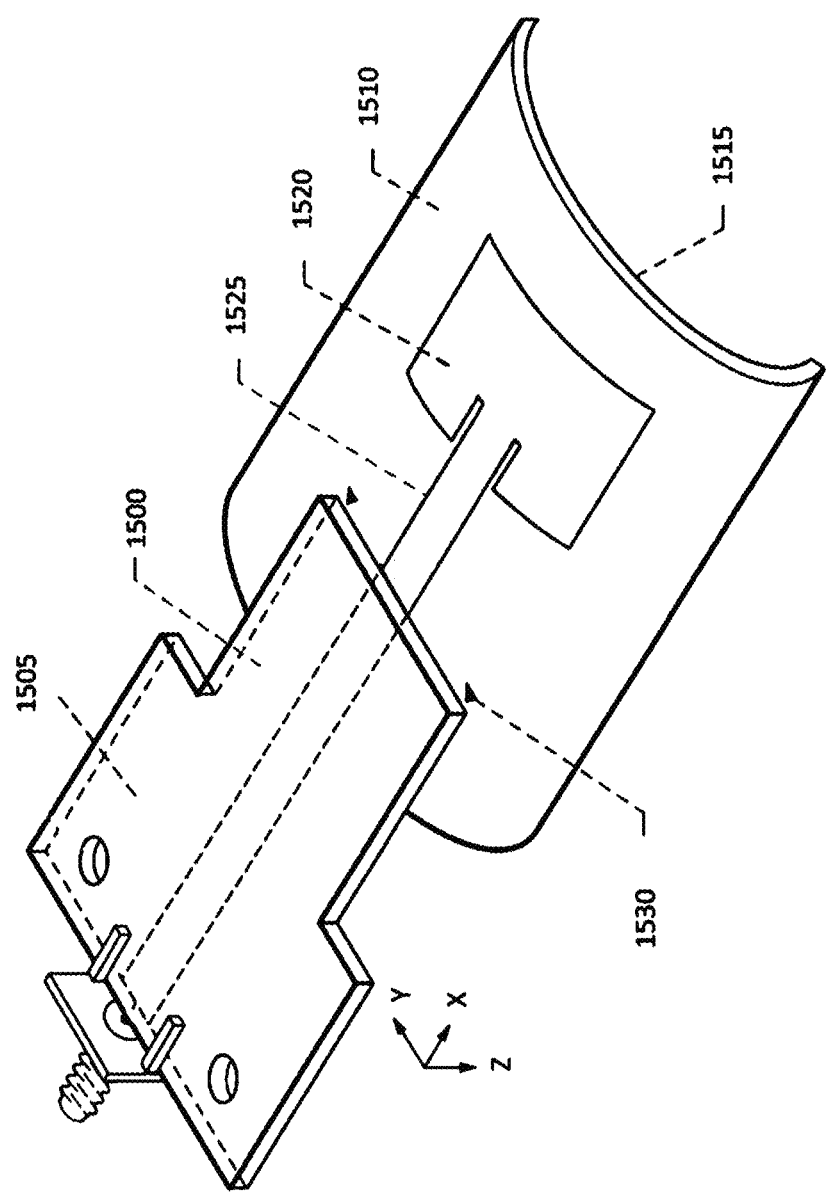
FIG. 15 illustrates an inverted microstrip probe with a microstrip patch antenna, according to an embodiment of the present invention.

FIG. 15 illustrates an inverted microstrip probe 1505 with a microstrip patch antenna 1520, according to an embodiment of the present invention. In this embodiment, inverted microstrip probe 1505 is placed above conformal dielectric substrate 1510 using alignment markers 1530. In this embodiment, an air gap (not shown) also separates inverted microstrip probe 1505 and conformal dielectric substrate 1510.

Beneath conformal dielectric substrate 1510 is a ground plane 1515, and above conformal dielectric substrate 1510 is a microstrip patch antenna 1520 and a microstrip feed line 1525 that overlaps with the inverted microstrip line of inverted microstrip probe 1505. Coupling between the inverted microstrip line of the probe and microstrip feed line 1525 is similar to FIG. 5. Alignment markers 1530 ensure that the inverted microstrip probe 1505 and microstrip feed line 1525 are aligned. In yet another embodiment, microstrip feed line 1525 may be coupled to an aperture fed microstrip patch antenna (not shown) or a slot antenna (not shown) on dielectric substrate 1510.

This embodiment enables a user to investigate the impact of the operating environment on the performance of a patch antenna using a PNA. For example, a sensor operating in a harsh environment will experience a change in the dielectric permittivity of the substrate material as the temperature changes. The change in the permittivity will shift the resonant frequency of the patch antenna. The shift in the resonant frequency will degrade the impedance match and lower the efficiency of the patch antenna.

Embodiments described herein pertain to a reliable, easily constructible, less expensive contactless RF probe for characterizing MICs, MMICs, devices, and printed antennas embedded in sensors fabricated on conformal or non-planar substrates, at elevated or cryogenic temperatures. For example, contactless RF probes may include inverted microstrip lines fabricated on a dielectric substrate. Coaxial connectors may be attached to one end of the microstrip lines to interface the contactless RF probes with a PNA for RF measurements. The other end of the microstrip lines is terminated in an open circuit or matched load (chip antenna).

Mounting holes may be provided in the dielectric substrate for attaching the contactless RF probes to an x-y-z axis positioners located on a probe station or similar apparatus. The distance traveled by the contactless RF probes along each axis may be controlled by micro-positioners. The x-axis and y-axis micro-positioners control the longitudinal and transversal movement of the contactless RF probes, receptively, and enable locating the contactless RF probes parallel and collinear with the input and output microstrip lines of the DUT. The z-axis micro-positioner controls the height of the air gap.

In addition, to assist the visual alignment of the contactless RF probes, alignment marks may be provided on the DUT substrate. Furthermore, the probe station may be equipped with a microscope to assist in the precise alignment of the RF probes with the DUT substrate. Moreover, the probe station may include a stage, which allows heating or cooling of the DUT substrate. In a further embodiment, the probe station may be located inside a chamber. The chamber may be evacuated or under pressure. Similarly, the chamber may be heated or cooled. The z-axis micro-positioner controls the distance of separation or the gap between the inverted microstrip line and the microstrip line of the DUT, which determines the amount of coupling. To enhance coupling between the microstrip lines, the probes are lowered such that the gap dimension is small and on the order of few tens of mils. In certain embodiments, DC bias pads are included on DUT substrate to apply a bias voltage to the active device.

The contactless RF probe in certain embodiments is based on RF characteristics of broadside coupled microstrip lines supported on two separate dielectric substrates. The contactless RF probes may be fabricated using photolithography techniques. The contactless nature of the RF probes allow characterizing MICs, MMICs, devices, and printed antennas at elevated temperatures without damaging the DUT or the contactless RF probes. The contactless RF probes and the DUT may be thermally isolated to simplify cryo-cooler designs and facilitate on-wafer RF measurements at cryogenic temperatures.

The contactless RF probes may also couple signals in and out from MICs, MMICs, devices, and antennas integrated on a non-planar and conformal substrate. The RF coupling between the contactless RF probes and the DUT can be reduced by increasing the height of the air gap in certain embodiments. This may enable characterization of high power RF transistors, amplifiers, and devices without exceeding the power handling limits of the test equipment.

These embodiments for contactless on-wafer characterization eliminate the need to saw and dice the wafer into smaller individual circuits for characterization, minimizing loss due to breakage and enhancing yield. Also, the contactless on-wafer characterization of MICs and devices also eliminate the need for custom-built test fixtures with special launchers/transitions, reducing the complexity, development time, and cost. The contactless on-wafer characterization technique is fast and inexpensive when automated for repeated measurements.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that embodiments of the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An apparatus, comprising:
a dielectric substrate having a first longitudinal axis;
at least one waveguide having a second longitudinal axis collinear with the first longitudinal axis of the dielectric substrate, the at least one waveguide comprising an electric field polarized parallel to the dielectric substrate to increase the coupling between the dielectric substrate and the at least one waveguide, and
an air gap separating the dielectric substrate and the at least one waveguide to prevent thermal loading, thermal expansion, and material deformity, wherein the first and second longitudinal axes extend through the air gap.

2. The apparatus of claim 1, wherein the at least one waveguide comprises a probe.

3. The apparatus of claim 2, wherein the probe comprises a contactless radio frequency probe.

4. The apparatus of claim 3, wherein the at least one waveguide includes a flared transition region configured to match impedance of the at least one waveguide with a free space impedance.

5. The apparatus of claim 4, wherein the at least one waveguide is a metal waveguide.

6. The apparatus of claim 5, wherein the metal waveguide is rectangular, circular, or an arbitrary shape.

7. The apparatus of claim 6, wherein the flared transition region is linear, curved, or an arbitrary shape.

8. The apparatus of claim 1, wherein the dielectric substrate includes a microstrip line or a slot line associated with a device under test.

9. The apparatus of claim 8, wherein the microstrip line or slot line includes a transition region.

10. The apparatus of claim 9, wherein the at least one waveguide is noncontact coupled with the transition region.

11. The apparatus of claim 10, wherein the slot line transition region includes a linear taper.

12. The apparatus of claim 11, wherein the dielectric substrate includes a dielectric step, a dielectric notch, or a cosine taper.

13. The apparatus of claim 10, wherein the microstrip line is positioned above the dielectric substrate and is curved along the transition region.

14. The apparatus of claim 13, further comprising a strip ground plane positioned below the dielectric substrate and curved in the opposite direction from the curved microstrip line.

15. The apparatus of claim 14, wherein the curved microstrip line and the curved strip ground plane are replaced with a series of stepped microstrip lines and stepped ground planes in the transition region.

16. The apparatus of claim 15, further comprising a second waveguide located at the other end of the dielectric substrate.

17. The apparatus of claim 16, wherein the second waveguide comprises a second probe.

18. The apparatus of claim 14, wherein the curved microstrip line and the curved strip ground plane also serve as a balanced-to-unbalanced transformer.

* * * * *